United States Patent
Goel et al.

(10) Patent No.: US 10,229,731 B1
(45) Date of Patent: Mar. 12, 2019

(54) METHOD, SYSTEM AND CIRCUIT FOR STAGGERED BOOST INJECTION

(71) Applicant: ARM Ltd., Cambridge (GB)

(72) Inventors: Ankur Goel, Noida (IN); Akshay Kumar, New Delhi (IN); Mohit Chanana, New Delhi (IN); Piyush Jain, Noida (IN)

(73) Assignee: ARM Ltd., Cambriege (GB)

( * ) Notice: Subject to any disclaimer, the term of this patent is extended or adjusted under 35 U.S.C. 154(b) by 0 days.

(21) Appl. No.: 15/730,597

(22) Filed: Oct. 11, 2017

(51) Int. Cl.
| | | |
|---|---|---|
| *G11C 11/00* | (2006.01) | |
| *G11C 11/412* | (2006.01) | |
| *G11C 11/419* | (2006.01) | |
| *G11C 7/10* | (2006.01) | |
| *G11C 7/12* | (2006.01) | |

(52) U.S. Cl.
CPC .......... *G11C 11/412* (2013.01); *G11C 7/1048* (2013.01); *G11C 7/12* (2013.01); *G11C 11/419* (2013.01)

(58) Field of Classification Search
CPC ....... G11C 11/412; G11C 7/1048; G11C 7/12; G11C 11/419
See application file for complete search history.

(56) References Cited

U.S. PATENT DOCUMENTS

| | | | |
|---|---|---|---|
| 5,859,632 A * | 1/1999 | Ito | G09G 3/3622 345/211 |
| 6,515,522 B2 * | 2/2003 | Inada | G09G 3/30 327/108 |
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 8,013,667 B2 * | 9/2011 | Ikehashi | H02N 1/006 327/536 |
| 9,514,814 B1 | 12/2016 | Sandhu et al. | |
| 9,548,118 B1 | 1/2017 | Bhavnagarwala et al. | |
| 9,558,819 B1 | 1/2017 | Aitken et al. | |
| 9,589,636 B1 | 3/2017 | Bhavnagarwala et al. | |
| 9,621,161 B1 | 4/2017 | Das et al. | |
| 9,627,615 B1 | 4/2017 | Reid et al. | |
| 9,660,189 B1 | 5/2017 | Reid et al. | |
| 9,734,895 B2 | 8/2017 | Savanth et al. | |
| 9,735,360 B2 | 8/2017 | Shifren et al. | |
| 9,735,766 B2 | 8/2017 | Shifren | |
| 9,747,982 B1 | 8/2017 | Shifren et al. | |
| 9,748,943 B2 | 8/2017 | Sandhu et al. | |
| 9,755,146 B2 | 9/2017 | Shifren et al. | |
| 9,773,550 B2 | 9/2017 | Bhavnagarwala et al. | |
| 2008/0107801 A1 | 5/2008 | Celinska et al. | |
| 2013/0285699 A1 | 10/2013 | McWilliams et al. | |
| 2017/0033782 A1 | 2/2017 | Shifren | |

(Continued)

*Primary Examiner* — Pho M Luu
(74) *Attorney, Agent, or Firm* — Berkeley Law & Technology Group, LLP (57) ABSTRACT

Disclosed are methods, systems and devices for operation of a circuit to boost a voltage at a load for a particular duration. A plurality of capacitors, each capacitor comprising at least a first terminal, may be coupled to an assisted node. At least a first capacitor and a second capacitor of the plurality of capacitors may maintain the assisted node at or about a target voltage for a duration. The second capacitor may be charged while the first capacitor is discharging in at least a portion of the duration.

24 Claims, 5 Drawing Sheets

(56) References Cited

U.S. PATENT DOCUMENTS

| | | |
|---|---|---|
| 2017/0045905 A1 | 2/2017 | Sandhu et al. |
| 2017/0047115 A1 | 2/2017 | Aitken et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |
| 2017/0077400 A1 | 3/2017 | Shifren et al. |
| 2017/0084331 A1 | 3/2017 | Bhavnagarwala et al. |
| 2017/0092858 A1 | 3/2017 | Shifren |
| 2017/0099049 A1 | 4/2017 | Sandhu et al. |
| 2017/0103809 A1 | 4/2017 | Bhavnagarwala et al. |
| 2017/0110191 A1 | 4/2017 | Aitken et al. |
| 2017/0117043 A1 | 4/2017 | Sandhu et al. |
| 2017/0147207 A1 | 5/2017 | Hansson et al. |
| 2017/0178718 A1 | 6/2017 | Savanth et al. |
| 2017/0178724 A1 | 6/2017 | Bhavnagarwala et al. |
| 2017/0179385 A1 | 6/2017 | Shifren et al. |
| 2017/0206963 A1 | 7/2017 | Bhavnagarwala et al. |
| 2017/0207784 A1 | 7/2017 | Das et al. |
| 2017/0213592 A1 | 7/2017 | Bhavnagarwala et al. |
| 2017/0213960 A1 | 7/2017 | Paz De Araujo et al. |
| 2017/0213961 A1 | 7/2017 | Paz De Araujo et al. |
| 2017/0237001 A1 | 8/2017 | Reid et al. |
| 2017/0243621 A1 | 8/2017 | Aitken et al. |
| 2017/0243622 A1 | 8/2017 | Sandhu et al. |
| 2017/0243646 A1 | 8/2017 | Shifren et al. |
| 2017/0244027 A1 | 8/2017 | Reid et al. |
| 2017/0244032 A1 | 8/2017 | Reid et al. |
| 2017/0250340 A1 | 8/2017 | Paz De Araujo et al. |

\* cited by examiner

METHOD, SYSTEM AND CIRCUIT FOR STAGGERED BOOST INJECTION

BACKGROUND

1. Field

Disclosed are techniques for boosting a signal voltage for a duration.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

A detectable state of a memory device may be affected or changed in response to a "write" operation such that the detectable state expresses or represents a particular value, symbol and/or condition, for example. In an implementation of a write operation, a programming signal applied to terminals of the memory device may apply a combination of a voltage and current between the terminals of the memory device affecting a physical state of the memory device so as to place the memory device in a desired detectable state. A subsequent "read" operation may be applied to the memory device to detect the particular value, symbol and/or condition expressed or represented by the desired detectable state for use in a computing procedure. Such a read operation may comprise applying a voltage across terminals of the memory device (e.g., from a precharged bitline) and measurement of a resulting current. In the course of a read operation, it may be desired to apply a programming signal across terminals of the memory device that is sufficiently large for reliable detection of the state of the memory device but sufficiently small so as to avoid an unintended change in a physical state of the memory that affects the detectable state expressing or representing the particular value, symbol and/or condition.

SUMMARY

Briefly, particular implementations are directed to a device comprising: a plurality of capacitors, each capacitor comprising at least a first terminal coupled to an assisted node; and circuitry to charge at least a first capacitor and a second capacitor of the plurality of capacitors to maintain the assisted node at or about a target voltage for a duration, wherein the circuitry is further configured to charge the second capacitor while the first capacitor is discharging in at least a portion of the duration.

Another particular implementations are directed to a method comprising: applying a first signal to a first terminal of a first capacitor to charge the first capacitor; and applying a second signal to a first terminal of a second capacitor to charge the second capacitor, wherein the second terminals of the first and second capacitors are coupled at an assisted node to maintain the assisted node at or about a target voltage for a duration, and wherein the second capacitor discharges into the assisted node while the first capacitor is still charging over at least a portion of the duration.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/ or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

In a particular embodiment, a memory device may be formed as a random access memory and/or non-volatile memory device using any one of several different physical memory technologies. Such memory technologies may include, for example, ferrite devices, dynamic random access memories (DRAMs) and Static-RAMs (SRAMs), non-volatile memories including electrically erasable programmable read-only memory (EEPROM) devices, Ferroelectric RAMs (FeRAMs) and magnetic memories (MRAMs). Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state.

Other memory devices may comprise memory devices formed from a correlated electron material (CEM) as a correlated electron switch (CES) that may be placed in a plurality of detectable impedance states. In an embodiment a CES may be formed as a correlated electron random access memory (CeRAM) device that may transition between or among a plurality of predetermined detectable memory states based, at least in part, on a transition of at least a portion of CEM between a conductive state and an insulative state utilizing a quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state.

In an implementation of a bitcell based on a CES, a read operation may comprise application of a read voltage across terminals of the CES (e.g., from a precharged bitline) and measurement of a current responsive to application of the read voltage. If an impedance state of the CES is a low impedance or conductive state during the read operation, a sufficiently high current in the CES responsive to application of the read voltage may result in an unintended change of the impedance state to high impedance or insulative state. Accordingly, one objective of an implementation is for a bitcell architecture allowing for reliable read and write operations.

Figure 1:
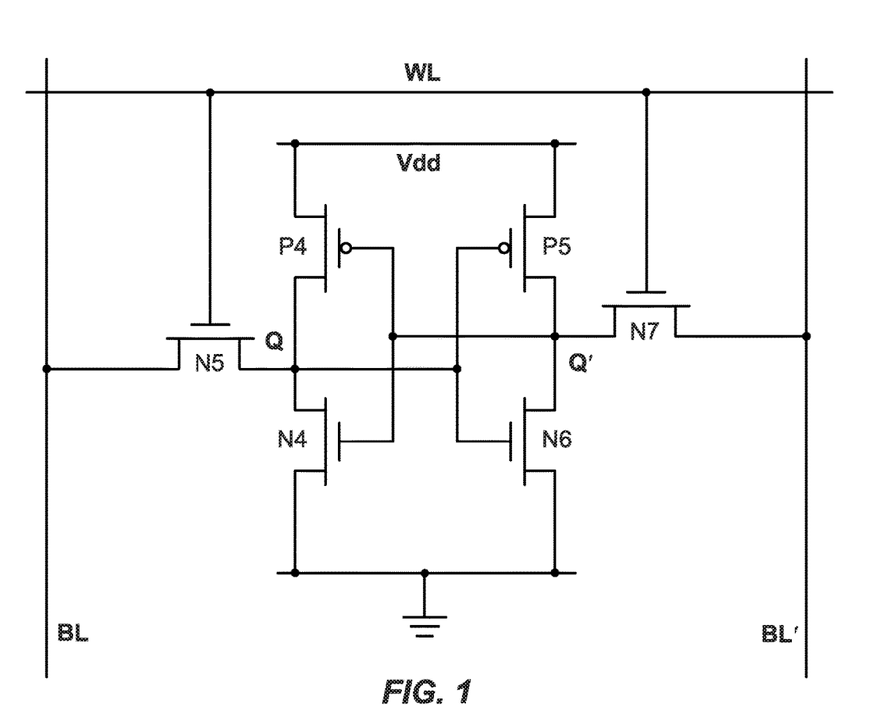
FIG. 1 is a schematic diagram of a bitcell according to an embodiment.

FIG. 1 is a schematic diagram of a bitcell circuit comprising an SRAM memory element according to an embodiment. In this context, a "bitcell" or "bitcell circuit" as referred to herein comprises a circuit or portion of a circuit capable of representing a value, symbol or parameter as a state. For example, a bitcell may comprise one or more memory devices that capable of representing a value, symbol or parameter as a memory state of the memory device. In particular implementations, a bitcell may represent a value, symbol or parameter as a single bit or multiple bits.

According to an embodiment, in a read operation, bitlines BL and BL' may be precharged to a particular voltage followed by a closing of FETs N5 and N7 responsive to a voltage on wordline WL. In this context, a "bitline" comprises a conductor that is connectable to at least one terminal of a memory element during a write operation to transmit a programming signal altering a memory state of the memory element, or during a read operation to transmit a signal indicative of a current memory state of the memory element. In a particular implementation of a read operation, a bitline may be connected to a terminal of a memory element through a conducting element in response to a voltage signal on a wordline. In this context, a "wordline" comprises a conductor for transmitting a signal to select a particular bitcell or group of bitcells to be accessed in a read operation or a write operation. In a particular example implementation, a voltage of a signal on a wordline may be raised or lowered to select or deselect a particular bitcell or group of bitcells to be connected to a corresponding bitline or group of bitlines during a read or write operation. It should be understood, however, that this is merely an example of a wordline and that claimed subject matter is not limited in this respect.

Responsive to application of a voltage signal from precharged bitlines BL and BL' from closing of FETs N5 and N7, a differential voltage on bitlines BL and BL' may be sensed for detecting a memory state. In a write operation, FETs N5 and N7 may be closed again in response to a voltage on wordline WL to apply a programming signal from bitlines BL and BL'.

According to an embodiment, a memory state may be written to the circuit of FIG. 1 responsive to a contention between pull-up PFETs P4 and P5, and pass-gate NFETs N5 and N7. To enable a reliable transition in memory state in a write operation, a voltage on wordline WL may be "boosted"

for a duration so as to allow a stronger response from NFETs N5 and N7 to reliably perform the write operation.

Figure 2:
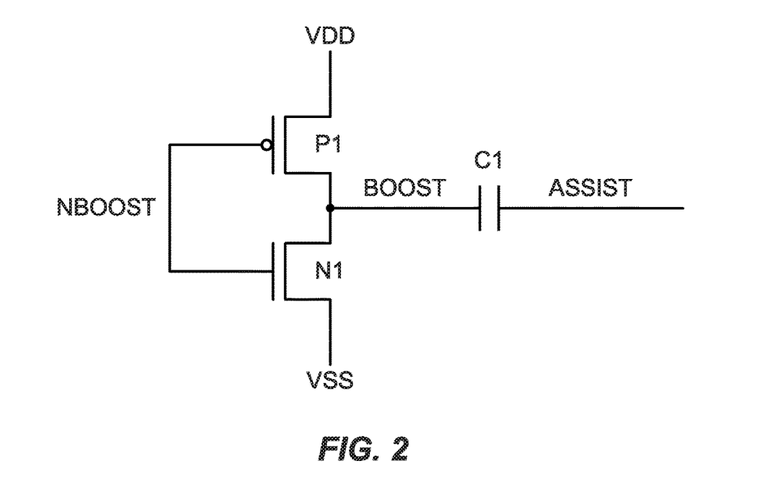
FIG. 2 is a schematic diagram of a circuit using a single capacitor for boosting a voltage to be applied in an operation according to an embodiment.

According to an embodiment, a boost circuit may be coupled to wordline WL or bitline BL' to boost signal voltage to enable a reliable write operation. In a particular implementation as shown in FIG. 2, a boost circuit may provide a boosted voltage for a duration on node ASSIST during write operations responsive to a change in voltage on node NBOOST. In one example, a wordline (such as wordline WL) may be coupled to node ASSIST to maintain a wordline voltage over a threshold voltage for a particular duration in a write operation. Here, a voltage at node NBOOST may initially be at source voltage VSS (e.g., 0.0V) such that NFET N1 is open (disconnecting node BOOST from source voltage VSS) and such that PFET P1 is closed (connecting node BOOST to voltage VDD). In a write operation, a voltage at node NBOOST may transition from source voltage VSS to voltage VDD such that node BOOST is disconnected from voltage VDD (by opening PFET P1) and connected to source voltage VSS (by closing NFET N1). This may boost a voltage at node ASSIST to a voltage above VDD until capacitor C1 fully discharges.

Figure 5A:
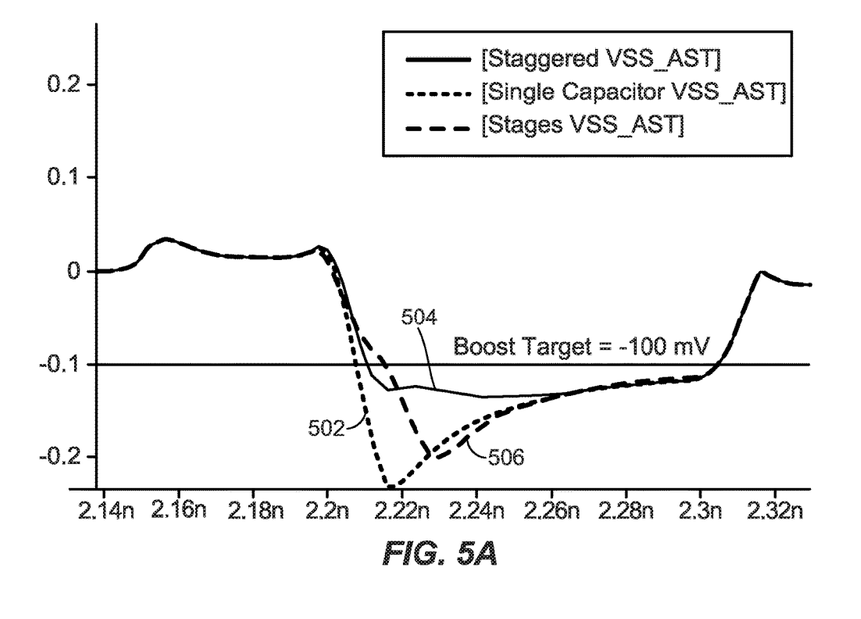
FIG. 5A comprises plots of voltages of nodes of a circuit according to an embodiment.

In another example, a bitline (such as bitline BL') may be coupled to node ASSIST to maintain a bitline voltage below a threshold voltage for a particular duration (e.g., negative bitline boost) in a write operation. In some implementations, a transistor (not shown) may be coupled between the bitline and node ASSIST to enable a decoupling of boost circuitry when not operating. For example, node ASSIST may be decoupled from the bitline while being precharged to a positive voltage prior to a read operation, for example. Here, a voltage at node NBOOST may initially be at voltage VDD (e.g., 0.4V) such that NFET N1 is closed (connecting node BOOST to source voltage VSS) and such that PFET P1 is opened (disconnecting node BOOST from voltage VDD). In a write operation, a voltage at node NBOOST may transition from voltage VDD to source voltage VSS such that node BOOST is connected to voltage VDD (by closing PFET P1) and disconnected from source voltage VSS (by opening NFET N1). This may pull a voltage at node ASSIST to a voltage below VDD until capacitor C1 fully discharges. Voltage at ASSIST node in FIG. 2 from this example is shown by plot 502 in FIG. 5. Following a negative peak voltage, capacitor C1 may discharge while voltage at ASSIST node is to be maintained below −100 mV for a duration in the write operation.

Figure 3:
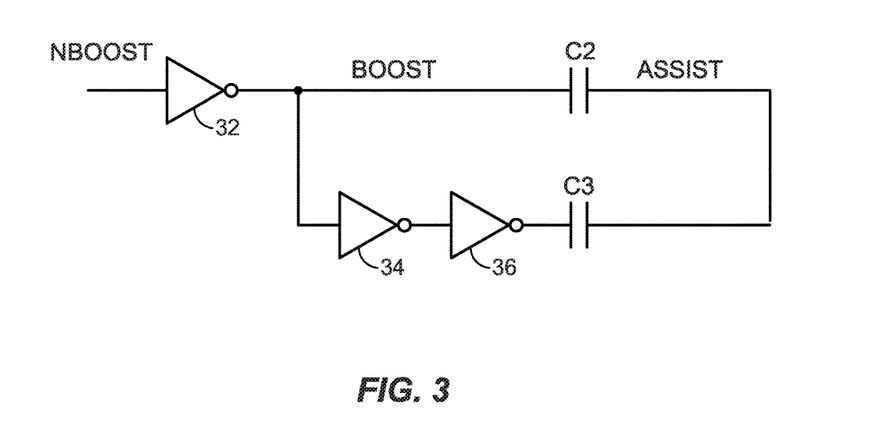
FIG. 3 is a schematic diagram of a circuit using multiple capacitors for boosting a voltage to be applied in an operation according to an embodiment.

The particular circuit implementation of FIG. 3 may be similarly applied for boosting voltage for a duration on node ASSIST during write operations responsive to a change in voltage on node NBOOST for maintaining a wordline voltage over a threshold voltage or maintaining a bitline voltage below a threshold voltage. Here, inverters 34 and 36 may delay charging of capacitor C3 in response to a change in voltage at NBOOST. This may allow for a lower peak voltage at node ASSIST needed to maintain a wordline voltage over a threshold voltage or maintain a bitline voltage below a threshold voltage for a duration in a write operation. Voltage at ASSIST node in FIG. 3 from this example is shown by plot 506 in FIG. 5. Following a negative peak voltage at node ASSIST, capacitors C2 and C3 may discharge while voltage at ASSIST node is to be maintained below −100 mV for a duration in the write operation. As may be observed, this may be accomplished with a negative peak voltage that is smaller than a negative peak voltage for plot 502 for the implementation of FIG. 2.

Similar to the implementations of FIGS. 2 and 3, the particular circuit implementations of FIGS. 4A and 4B may be applied for boosting voltage for a duration on node ASSIST during write operations responsive to a change in voltage on node NBOOST for maintaining a wordline voltage over a threshold voltage or maintaining a bitline voltage below a threshold voltage. However, the particular implementations of FIGS. 4A and 4B may achieve boosting a voltage over a duration with a smaller positive or negative peak voltage. This may reduce stress on circuits that experience frequent write operations and enhance durability.

Figure 4A:
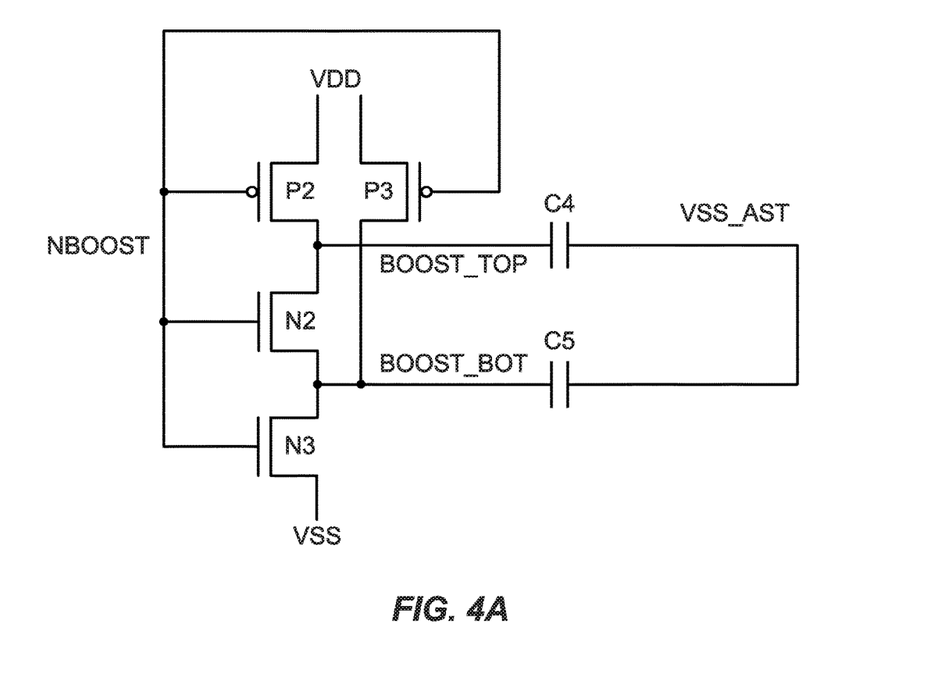
FIGS. 4A and 4B are schematic diagrams of circuits using multiple capacitors for boosting a voltage to be applied in an operation according to an alternative embodiment.

The circuit implementation of FIG. 4A comprises capacitors C4 and C5, which may be equally sized. The circuit implementation of FIG. 4A may be applied in an operation to provide a negative boost to a bitline (at a boost node designated as VSS_AST for this particular application). In an operation to apply a negative boost to a bitline voltage for a write operation, for example, a voltage at node NBOOST may transition from source voltage VSS to voltage VDD so as to open PFETs P2 and P3 to disconnect nodes BOOST_TOP and BOOST_BOT from voltage supply VDD maintained at voltage VDD. Also, increasing voltage at node NBOOST from source voltage VSS to voltage VDD may close NFETs N2 and N3 to connect nodes BOOST_TOP and BOOST_BOT to source voltage VSS. In a particular implementation, NFETs N2 and N3 may be sized differently such that there is a significantly larger separation between source and drain terminals of NFET N3 than a separation between source and drain terminals of NFET N4 (e.g., separation between source and drain terminals of NFET N3 may be four times that of separation between source and drain terminals of NFET N4). In an initial state, NFET N2 may have source and drain voltages at VDD while NFET N3 may have drain voltage at VDD and a source voltage at VSS. As a voltage at node NBOOST increases from source voltage VSS to voltage VDD, NFET N3 closes to pull voltage at node BOOST_BOT at a particular rate to provide a boosted voltage at nodeVSS_AST. Over the period as the voltage at node NBOOST rises, NFET N3 may close first transitioning the drain voltage at NFET N3 to VSS. NFET N2 may remain at least partially open until NFET N3 closes first. NFET N2 may then close as the source voltage of NFET N2 transitions to VSS. Here, charge from capacitor C5 may provide an initial boost in response to as NFET N3 closing. NFET N2 remains partially closed until NFET N3 has pulled the voltage at node BOOST_BOT sufficiently low. This may enable NFET N2 to provide a gradual and delayed injection of current to node VSS_AST from capacitor C4 to at least partially offset losses following the initial boost from capacitor C5.

Accordingly, capacitors C4 and C5 may maintain node VSS_AST at or about a target voltage for a duration of time. Such a target voltage may comprise a boosted voltage for application for to a wordline, or a negative bitline boost voltage as described above. Additionally, NFETs N2 and N3 are sized such that capacitor C4 may charge while capacitor C5 is discharging over at least a portion of the duration that the target voltage is to be maintained.

Figure 4B:
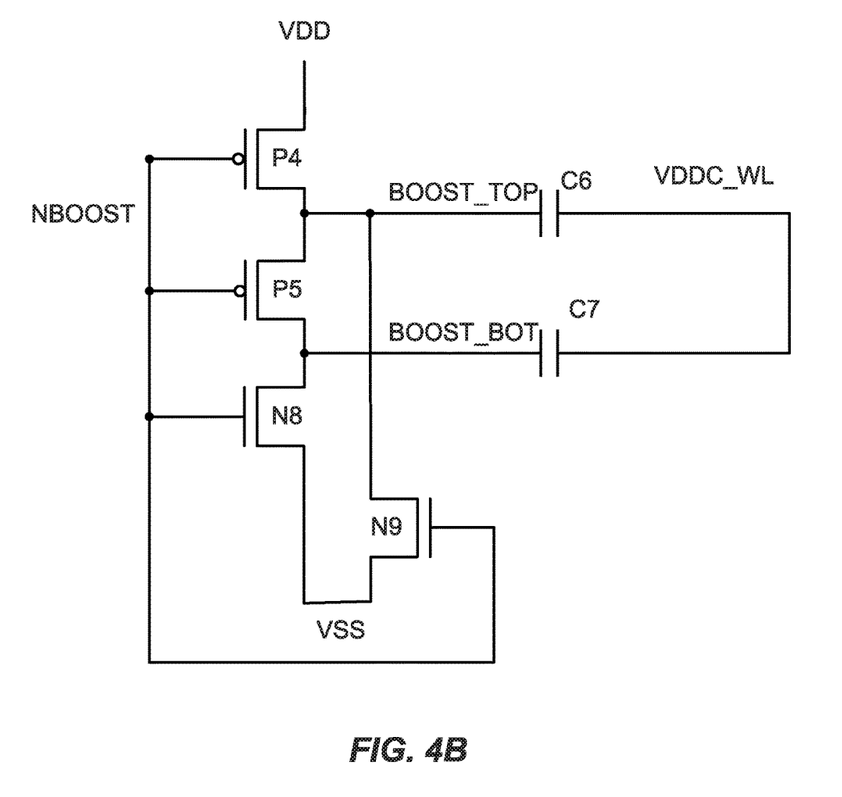

The circuit implementation of FIG. 4B may be applied in an operation to boost a wordline voltage (at a boost node designated as VDDC_WL for this particular application). In an operation to apply a boost to a wordline voltage for a write operation, for example, a voltage at node NBOOST may transition from voltage VDD to source voltage VSS to as to open NFETs N8 and N9 to disconnect nodes BOOST_TOP and BOOST_BOT from source voltage VSS. Also, decreasing voltage at node NBOOST from voltage VDD to source voltage VSS to close PFETs P4 and P5 to connect nodes BOOST_TOP and BOOST_BOT to voltage supply VDD maintained at voltage VDD. In a particular implementation, PFETs P4 and P5 may be sized differently such that there is a significantly larger separation between source and drain terminals of PFET P4 than a separation between source and drain terminals of PFET P5 (e.g., separation between source and drain terminals of PFET P4 may be four times that of separation between source and drain terminals of PFET P5). As a voltage at node NBOOST decreases from voltage VDD to source voltage VSS, PFET P4 closes to pull voltage at node BOOST_BOT at a particular rate to provide a boosted voltage at node VDDC_WL. Over the period as the voltage at node NBOOST decreases, PFET P4 may close first transitioning the source voltage at PFET P4 to VDD. PFET P5 may remain at least partially open until PFET P4 closes first. PFET P5 may then close as the source voltage of PFET P4 transitions to VDD. Here, charge from capacitor C6 may provide an initial boost in response to PFET P4 closing. PFET P5 remains partially closed until PFET P4 has pulled the voltage at node BOOST_TOP sufficiently high. This may enable PFET P5 to provide a gradual and delayed injection of current to node VDD_WL from capacitor C7 to at least partially offset losses following the initial boost from capacitor C6.

Accordingly, capacitors C6 and C7 may maintain node VDDC_WL at or about a target voltage for a duration of time. Such a target voltage may comprise a boosted voltage for application for to a wordline as described above. Additionally, PFETs P4 and P5 are sized such that capacitor C7 may charge while capacitor C6 is discharging over at least a portion of the duration that the target voltage is to be maintained at node VDDC_WL.

Figure 5B:
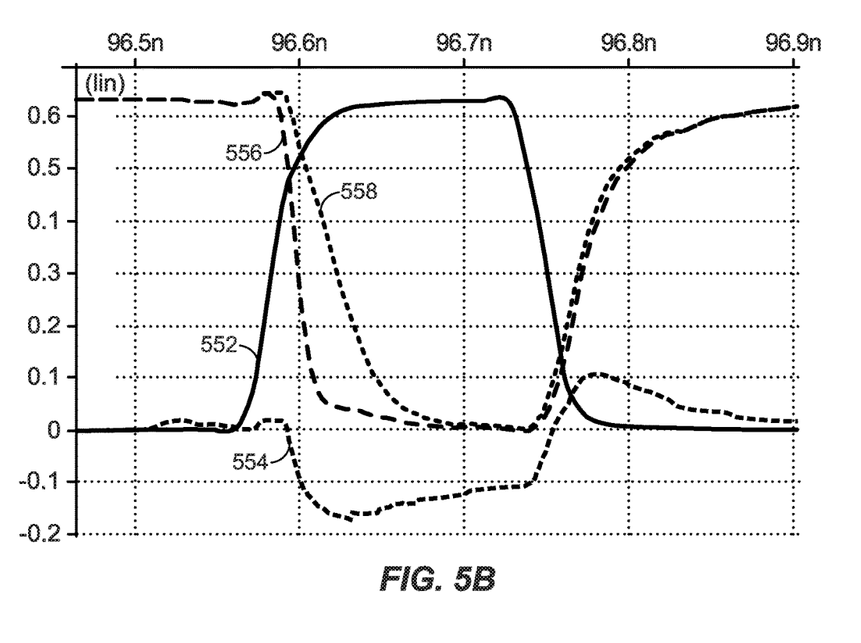
FIG. 5B comprises plots of a boosted voltage signal for different circuits employing capacitors according to particular embodiments.

In FIG. 5B, plots 552, 554, 556 and 558 show voltages at nodes NBOOST, VSS_AST, BOOST_BOT and BOOST_TOP according to an application of the circuit of FIG. 4A to provide a negative boost to a bitline according to an embodiment. FIG. 5B is provided as an example illustration of how the circuit of FIG. 4A may behave under particular condition. It should be understood that the circuit of FIG. 4B may similarly provide a positive voltage boost to a wordline over a duration according to an alternative implementation. As voltage at node NBOOST transitions high as shown in plot 552, voltage at node BOOST_BOT drops sharply as shown by plot 556. In response, voltage at node VSS_AST is pulled lower as shown by plot 554. Also, shortly following drop of voltage at node BOOST_BOT, voltage at node BOOST_TOP begins to drop as shown by plot 558. Here, it may be observed that voltage at node BOOST_TOP drops at a lower rate than does voltage at node BOOST_BOT as reflected by different slopes of plots 556 and 558. The more gradual drop in voltage at node BOOST_TOP as reflected in plot 558 may allow for voltage at node VSS_AST to stay low for an extended period as reflected by plot 554.

Figure 6:
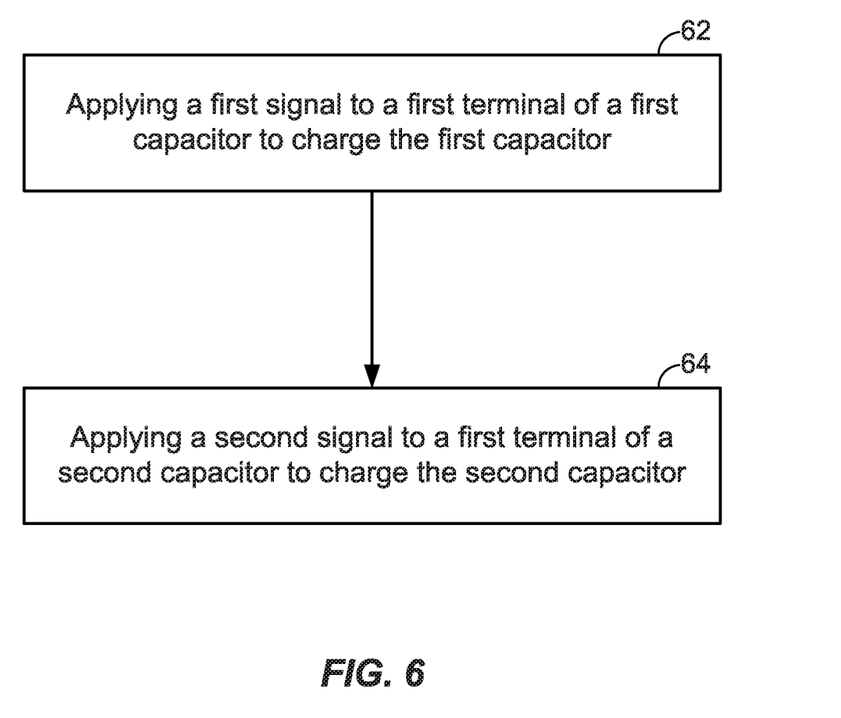
FIG. 6 is a flow diagram of a process according to an embodiment.

FIG. 6 is a flow diagram of a process to operate a circuit as shown in FIG. 4A or 4B according to implementations. In a first implementation in connection with FIG. 4A, at block 62, responsive to NBOOST being raised from source voltage VSS to voltage VDD, PFETs P3 may open to disconnect node BOOST_BOT from voltage VDD and NFET N3 may close to connect node BOOST_BOT to source voltage VSS. Capacitor C5 may then begin charging. With a disconnection of node BOOST_TOP from voltage VDD and connection of node BOOST_TOP to source voltage VSS, capacitor C4 may gradually charge at block 64 as a voltage across NFET N3 maintains NFET N2 partially closed. Node VSS_AST may then be maintained at a target voltage for a duration such that capacitor C5 is discharging while capacitor C4 is still charging.

In a second implementation, at block 62, responsive to NBOOST being lowered from voltage VDD to source voltage VSS, PFET P4 may close to connect node BOOST_TOP to voltage VDD and PFET P5 may close to connect node BOOST_BOT to voltage VDD. Capacitor C6 may then begin charging. With a connection of node BOOST_TOP to voltage VDD and disconnection of node BOOST_TOP from source voltage VSS, capacitor C7 may gradually charge at block 64 as a voltage across PFET P4 maintains PFET P5 partially closed. Node VDDC_WL may then be maintained at a target voltage for a duration such that capacitor C6 is discharging while capacitor C7 is still charging.

In this context, a "conducting element" comprises a circuit element capable of permitting current to pass between two nodes. In a particular implementation, a conducting element may vary a current permitted to pass between nodes based, at least in part, on a particular condition. The particular implementations described herein employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

In a further embodiment, one or more of a plurality of memory devices (e.g., CES devices) may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective memory devices, in an embodiment. In a further embodiment, memory devices may be formed in devices in combination with conducting elements as described herein formed by the same or different processes. In an example implementation, memory devices may be formed in combination with conducting elements using a different and/or complementary process technologies such as complementary metal oxide semiconductor (CMOS) technologies. For example, conducting elements such as NFET and PFET devices may be formed using well known processes and techniques. Furthermore, a capacitor, such as a capacitor in circuits described above, may also be formed using well known techniques such as by connecting source and drain terminals of a FET device to form a first terminal of the capacitor while a gate terminal of the FET device provides a second terminal of the capacitor.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A device comprising:
a plurality of capacitors, each capacitor comprising at least a first terminal coupled to an assisted node; and
circuitry to charge at least a first capacitor and a second capacitor of the plurality of capacitors to maintain the assisted node at or about a target voltage for a duration in a write operation to alter a state of a memory element, wherein the circuitry is further configured to charge the second capacitor while the first capacitor is discharging in at least a portion of the duration.

2. The device of claim 1, wherein the circuitry further comprises a first conducting element to connect a second terminal of the first capacitor to a common source voltage responsive to a boost selection signal.

3. The device of claim 2, wherein the circuitry further comprises a second conducting element to connect the second terminal of the first capacitor to a second terminal of the second capacitor responsive to the boost selection signal.

4. The device of claim 3, wherein the first and second conducting elements comprise NFET transistors, and wherein the first conducting element is configured to connect the second terminal of the first capacitor to the common source voltage responsive to a first gate voltage and the second conducting element is configured to connect the second terminal of the second capacitor to the second terminal of the first capacitor responsive to a second gate voltage.

5. The device of claim 4, wherein the first conducting element comprises a source terminal and a drain terminal having a physical separation larger than a separation between source and drain terminals of the second conducting element.

6. The device of claim 5, wherein the physical separation between the source and drain terminals of the first conducting element is at least twice the physical separation between the source and drain terminals of the second conducting element.

7. The device of claim 1, wherein the circuitry further comprises a first conducting element to connect a second terminal of the first capacitor to a voltage supply responsive to a boost selection signal.

8. The device of claim 7, wherein the circuitry further comprises a second conducting element to connect the second terminal of the first capacitor to a second terminal of the second capacitor responsive to the boost selection signal.

9. The device of claim 8, wherein the first and second conducting elements comprise PFET transistors, and wherein the first conducting element is configured to connect the second terminal of the first capacitor to the voltage supply responsive to a first gate voltage and the second conducting element is configured to connect the second terminal of the second capacitor to the second terminal of the first capacitor responsive to a second gate voltage.

10. The device of claim 9, wherein the first conducting element comprises a source terminal and a drain terminal having a physical separation that is larger than a physical separation between source and drain terminals of the second conducting element.

11. The device of claim 10, wherein the physical separation between the source and drain terminals of the first conducting element is at least twice the physical separation between the source and drain terminals of the second conducting element.

12. The device of claim 1, wherein at least the first capacitor comprises an NFET transistor comprising source and drain terminals connected to form the first terminal of the first capacitor and a gate terminal to form a second terminal of the first capacitor.

13. The device of claim 1, wherein the assisted node is configured to boost a voltage at a wordline coupled to the memory element.

14. The device of claim 1, wherein the assisted node is configured to apply a negative voltage boost to a bitline coupled to the memory element.

15. A method comprising:
applying a first signal to a first terminal of a first capacitor to charge the first capacitor; and
applying a second signal to a first terminal of a second capacitor to charge the second capacitor,
wherein second terminals of the first and second capacitors are coupled at an assisted node to maintain the assisted node at or about a target voltage for a duration in a write operation to alter a state of a memory element, and wherein the second capacitor discharges into the assisted node while the first capacitor is still charging over at least a portion of the duration.

16. The method of claim 15, and further comprising connecting a second terminal of the first capacitor to a common source voltage responsive to a boost selection signal.

17. The method of claim 16, and further comprising connecting the second terminal of the first capacitor to a second terminal of the second capacitor responsive to the boost selection signal.

18. The method of claim 17, and further comprising connecting the second terminal of the first capacitor to the common source voltage responsive to a first gate voltage applied to a first NFET transistor and connecting the second terminal of the second capacitor to the second terminal of the first capacitor responsive to a second gate voltage applied to a second NFET transistor.

19. The method of claim 1, and further comprising connecting a second terminal of the first capacitor to a supply voltage responsive to a boost selection signal.

20. The method of claim 19, and further comprising connecting the second terminal of the first capacitor to a second terminal of the second capacitor responsive to the boost selection signal.

21. The method of claim 20, and further comprising connecting the second terminal of the first capacitor to the supply voltage responsive to a first gate voltage applied to a first PFET transistor and connecting the second terminal of the second capacitor to the second terminal of the first capacitor responsive to a second gate voltage applied to a second PFET transistor.

22. The method of claim 15, wherein at least the first capacitor comprises an NFET transistor comprising source and drain terminals connected to form the first terminal of the first capacitor and a gate terminal to form a second terminal of the first capacitor.

23. The method of claim 15, wherein the assisted node is configured to boost a voltage at wordline coupled to the memory element.

24. The method of claim 15, wherein the assisted node is configured to apply a negative voltage boost to a bitline coupled to the memory element.

* * * * *